(12) United States Patent
Yeo et al.

(10) Patent No.: US 7,262,086 B2
(45) Date of Patent: Aug. 28, 2007

(54) CONTACTS TO SEMICONDUCTOR FIN DEVICES

(75) Inventors: Yee-Chia Yeo, Singapore (SG); Fu-Liang Yang, Hsin-Chu (TW); Chenming Hu, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/478,916

(22) Filed: Jun. 30, 2006

(65) Prior Publication Data

US 2006/0244066 A1 Nov. 2, 2006

(51) Int. Cl.
*H01L 21/339* (2006.01)
(52) U.S. Cl. ...................... 438/149; 438/197
(58) Field of Classification Search .............. 257/347, 257/774, 753, 754, 763; 438/149, 197, 479, 438/176, 517, 157, 283, 199, 298
See application file for complete search history.

(56) References Cited

U.S. PATENT DOCUMENTS

| | | | | |
|---|---|---|---|---|
| 6,888,252 | B2 * | 5/2005 | Derraa | 257/774 |
| 6,913,960 | B2 * | 7/2005 | Bryant et al. | 438/199 |

* cited by examiner

*Primary Examiner*—Howard Weiss
*Assistant Examiner*—(Vikki) Hoa B. Trinh
(74) *Attorney, Agent, or Firm*—Tung & Associates

(57) ABSTRACT

A method for forming a contact to a semiconductor fin which can be carried out by first providing a semiconductor fin that has a top surface, two sidewall surfaces and at least one end surface; forming an etch stop layer overlying the fin; forming a passivation layer overlying the etch stop layer; forming a contact hole in the passivation layer exposing the etch stop layer; removing the etch stop layer in the contact hole; and filling the contact hole with an electrically conductive material.

44 Claims, 6 Drawing Sheets

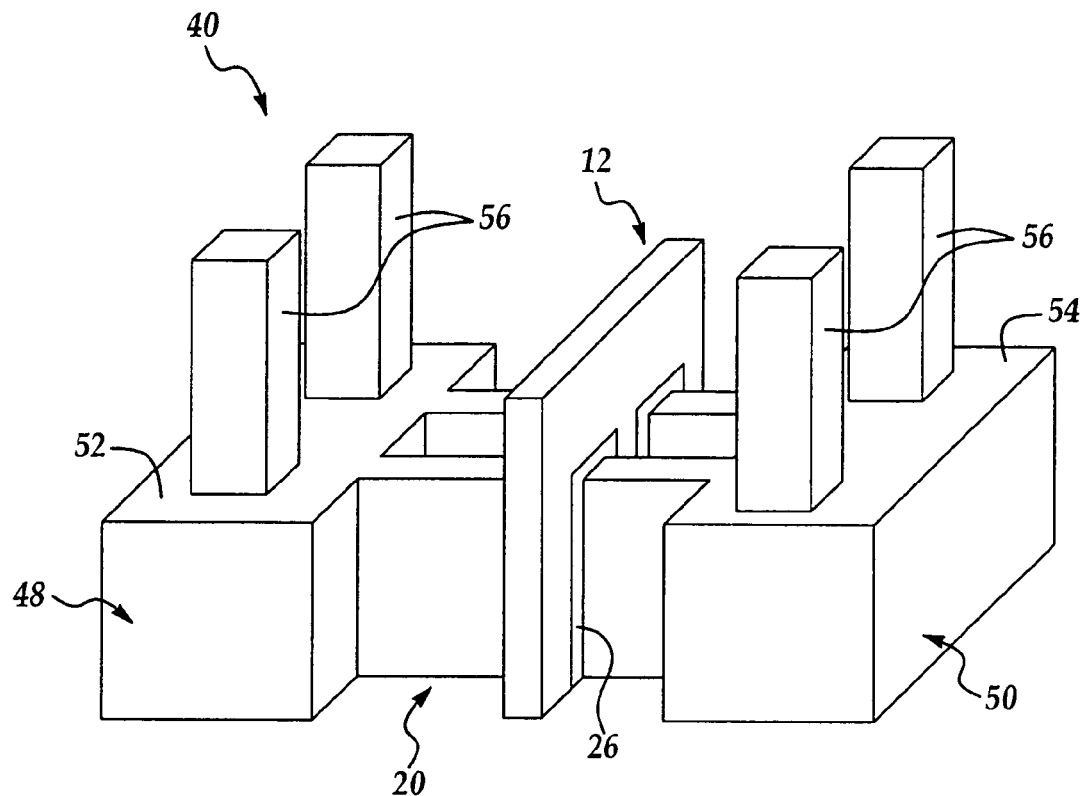
*Figure 5*
*Prior Art*
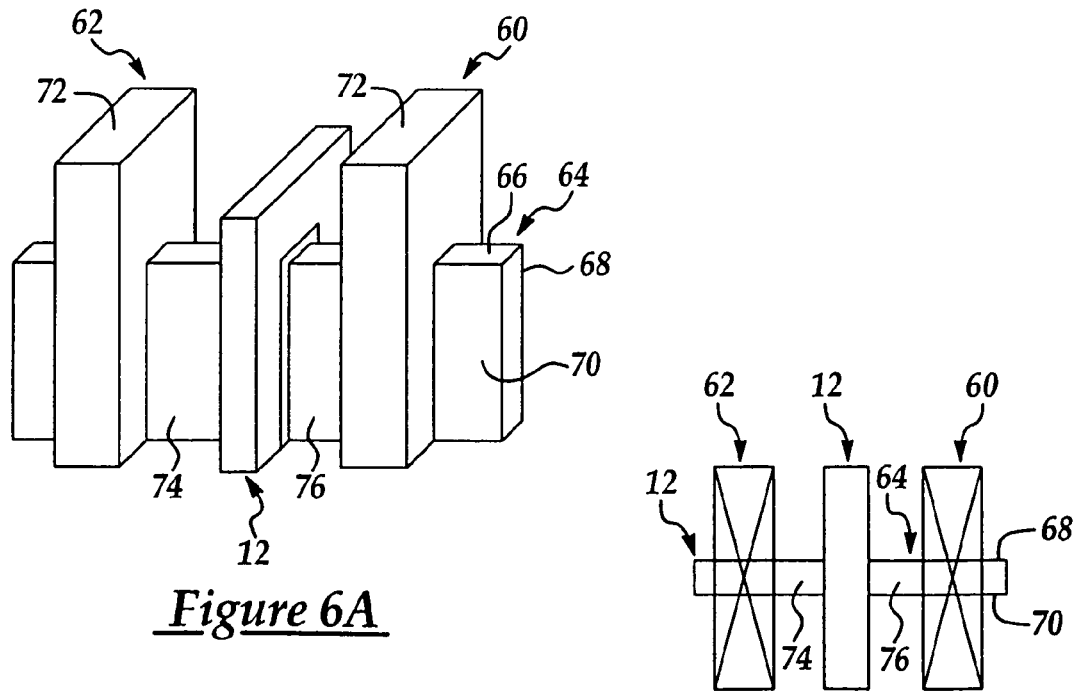
*Figure 6A*
*Figure 6B*

CONTACTS TO SEMICONDUCTOR FIN DEVICES

FIELD OF THE INVENTION

The present invention relates to the field of semiconductor devices, and more specifically, to the manufacture of metal oxide semiconductor field effect transistors (MOSFETs) with multiple-gates and low contact resistances.

BACKGROUND OF THE INVENTION

The dominant semiconductor fabrication technology used for the manufacture of the ultra-large scale integrated (USLI) circuits is the metal-oxide-semiconductor field effect transistor (MOSFET) technology. Reduction in the size of MOSFETs has provided continued improvement in speed performance, circuit density, and cost per unit function over the past few decades. As the gate length of the conventional bulk MOSFET is reduced, the source and drain increasingly interact with the channel and gain influence on the channel potential. Consequently, a transistor with a short gate length suffers from problems related to the inability of the gate to substantially control the on and off states of the channel. Phenomena such as reduced gate control associated with transistors with short channel lengths are termed short-channel effects. Increased body doping concentration, reduced gate oxide thickness, and ultra-shallow source/drain junctions are ways to suppress short-channel effects in the conventional bulk MOSFET. However, for device scaling well into the sub-50 nm regime, the requirements for body-doping concentration, gate oxide thickness, and source/drain (S/D) doping profiles become increasingly difficult to meet when conventional device structures based on bulk silicon (Si) substrates are employed. Innovations in front-end-process technologies or the introduction of alternative device structures are required to sustain the historical pace of device scaling.

A promising approach to controlling short-channel effects is to use an alternative device structure with a multiple-gate. Examples of multiple-gate structures include the double-gate structure, the triple-gate structure, the omega-FET structure, and the surround-gate or wrap-around gate structure. A multiple-gate transistor structure is expected to extend the scalability of CMOS technology beyond the limitations of the conventional bulk MOSFET and realize the ultimate limit of silicon MOSFETs. The introduction of additional gates improves the capacitance coupling between the gates and the channel, increases the control of the channel potential by the gate, helps suppress short channel effects, and prolongs the scalability of the MOS transistor.

An example of a multiple-gate device is the double-gate MOSFET structure, where there are two gate electrodes on the opposing sides of the channel or silicon body. A manufacturable way to fabricate a double-gate MOSFET is descried by U.S. Pat. No. 6,413,802B1, issued to Hu et al, as shown in FIGS. 1A-1C for a FinFET transistor structure 10 having a double-gate electrode 12 extending vertically from a substrate 14 and method of manufacture. In U.S. Pat. No. 6,413,802B1, the device channel comprises a thin silicon fin 20 formed on an insulating substrate 16 (i.e. silicon oxide) and defined using an etchant mask 18. The etchant mask 18 of U.S. Pat. No. 6,413,802B1 is retained on the fin 20 in the channel region throughout the process. Gate oxidation is performed, followed by gate deposition and gate patterning to form the gate electrode 12 that straddles across the fin 20 with a gate dielectric layer 26 in-between. A three-dimensional perspective view of this device structure is illustrated in FIG. 1A. Both the source-to-drain directions and the gate-to-gate directions are in the plane of the substrate surface. The cross-sectional and plane view of the double-gate structure are shown in FIGS. 1B and 1C, respectively. U.S. Pat. No. 6,413,802B1, however, does not teach the geometry end structure of contacts to the source and drain regions 22,24. U.S. Pat. No. 6,413,802B1 also does not teach a method of forming contacts with the source and drain regions 22,24 of the double-gate transistor 10. In fact, the fins 20 constituting the double-gate device of U.S. Pat. No. 6,413,802B1 each has an end connected to a source island and the other end connected to a drain island. In a paper by S. H. Tang, et al., entitled "FINFET—A quasi-planar double-gate MOSFET", published at the 2001 IEEE International Solid State Circuits Conference, San Francisco, Calif., pp. 118-119, a double-gate FinFET structure with source/drain contacts made along the sides and the end of the fin was mentioned. However, the paper did not teach a method of forming contacts with the fin on the sidewalls.

An example of a multiple-gate transistor with three gates is the triple-gate transistor. The cross-section of the triple-gate transistor 30 is illustrated in FIGS. 2A and 2B. The plane view of the triple-gate transistor 30 is shown in FIG. 2C. The triple-gate transistor 30 is also shown in FIG. 3A. The triple-gate transistor 30 achieves better gate control than the double-gate device because it has one more gate 32 on the top of the silicon fin. In a paper by R. Chau et al., entitled "Advanced depleted-substrate transistors: single-gate, double-gate, and tri-gate", published at the 2002 International Conference on Solid State Devices and Materials, Nagoya, Japan, pp. 68-69, September 2002, a triple-gate transistor was reported. In that paper, the fins constituting the triple-gate transistor each has an end connected to a source island and the other end connected to a drain island. Contacts to the source and drain regions were formed on the top surface of the source and drain islands, respectively.

Yet another example of the multiple-gate transistor is the omega field-effect transistor, or the omega-FET. The omega-FET is an improved triple-gate transistor structure and has the closest resemblance to the Gate-All-Around (GAA) transistor for excellent scalability, and uses a very manufacturable process similar to that of the double-gate or triple-gate transistor. The omega-FET has a gate electrode with a omega-shaped cross-section (FIG. 2B). A three-dimensional perspective view of an omega-FET is shown in FIG. 3B.

While there is some work on the design and fabrication of multiple-gate devices such as the double-gate and triple-gate devices, there is little work focusing on the improvement or reduction of contact resistance in such devices. Contact resistance is a major fraction of the series resistance in nanoscale devices. Series resistance acts to reduce the drive current and the speed performance of transistors. The higher the series resistance, the lower the drive current for a given supply voltage. There is an increasing concern about the series resistance being a factor that degrades speed performance for CMOS scaling into the nanometer regime. The aforementioned multiple-gate devices have a common feature: a semiconductor fin.

Transistors with two or more gates, including the double-gate transistor, the triple-gate transistor, and the omega-FET, are termed "multiple-gate transistors". The present invention relates to the provision of low resistance contacts to the source and drain regions in multiple-gate transistors. A common feature of the multiple-gate transistor, as illustrated in FIGS. 1A-3B, is the semiconductor fin constituting the transistor body. The semiconductor fin may be an elemental semiconductor such as silicon or germanium, an alloy semiconductor such as silicon-germanium, or a compound semiconductor such as indium phosphide and gallium arsenide. In the preferred embodiment, the semiconductor is silicon. The semiconductor fin found in the double-gate, triple-gate, and omega-FET device structures has three surfaces: a top surface and two sidewall surfaces. Another common feature of the transistors is that they are provided on semiconductor-on-insulator substrates. The insulator may be comprised of a dielectric such as silicon oxide, silicon nitride, or aluminum oxide.

In a conventional transistor, contact holes typically expose only one planar surface of the source ad drain regions. Therefore, conductive material filling the contact holes make contact with the source and drain regions at one planar surface. In fact, a prior art triple-gate transistor 40 adopted the traditional source and drain contact structure where the contacts to the source and drain regions are made at the top surface of the silicon, as shown in a plane view in FIG. 4. In FIG. 4, three silicon fins 42,44,46 are schematically shown. The silicon fins 42,44,46 are each connected to a source island 48 on one end and to the drain island 50 on the other end. A three-dimensional perspective view of a portion of the structure 40 of FIG. 4 is illustrated in FIG. 5. Contact holes are made to expose the top surfaces 52,54 of the source and drain islands 48,50 so that conductive materials 56 filling the contact holes make contact with the top surfaces 52,54 of the source and drain islands 48,50. More specifically, the contact surface 52,54 (or top surfaces) between the conductive material 56 and the source or drain islands 48,50 lay on a planar surface.

It is therefore an object of the present invention to provide an improved method of forming multiple-gate transistors with low series resistance.

It is yet another object of the present invention to provide a method of forming a low contact resistance and large contact area in multiple-gate transistors.

SUMMARY OF THE INVENTION

In accordance with the present invention, a method for forming a contact to a semiconductor fin and a contact thus formed are disclosed.

In a preferred embodiment, a method for forming a contact to a semiconductor fin can be carried out by the operating steps of first providing a semiconductor fin that has a top surface, two sidewall surfaces and at least one end surface; forming an etch stop layer overlying the fin; forming a passivation layer overlying the etch stop layer; forming a contact hole in the passivation layer exposing the etch stop layer; removing the etch stop layer in the contact hole; and filling the contact hole with an electrically conductive material.

The method for forming a contact to a semiconductor fin may further include the step of exposing the etch stop layer on the top surface and the two sidewall surfaces of the fin, or the step of exposing the etch stop layer on the top surface, the two sidewall surfaces and the at least one end surface of the fin. The method may further include the step of forming the etch stop layer using a dielectric material, or the step of forming the etch stop layer using a material that includes silicon nitride, or the step of forming the etch stop layer in a silicon nitride layer overlying a silicon oxide layer. The method may further include the step of forming the etch stop layer to a thickness between about 10 angstroms and about 1000 angstroms.

In the method for forming a contact to a semiconductor fin, an etch selectivity of the passivation layer over the etch stop layer is at least 2. This means that the etchant that is used to etch the passivation layer etches the etch stop layer at a rate that is at least 2 times slower. The method may further include the step of forming the passivation layer in a dielectric material, or the step of forming the passivation layer in a silicon oxide, or the step of forming the passivation layer to a thickness between about 500 angstroms and about 3000 angstroms. The method may further include the step of filling the contact hole with a metal, or the step of filling the contact hole in a material including metallic nitride, or the step of filling the contact hole in a material including metallic silicide, or the step of filling the contact hole in a material including a conductive oxide, or the step of filling the contact hole in a material including a heavily doped semiconducting material.

The present invention is further directed to a method for forming a contact to a multiple-gate transistor which can be carried out by the operating steps of first providing a multiple-gate transistor that includes a fin; forming an etch stop layer overlying the fin; forming a passivation layer overlying the etch stop layer; forming a contact hole in the passivation layer exposing the etch stop layer; removing the etch stop layer exposed in the contact hole; and filling the contact hole with an electrically conductive material.

The method for forming a contact to a multiple-gate transistor may further include the step of providing a double-gate transistor, or the step of providing a triple-gate transistor, or the step of providing an omega field-effect transistor. The method may further include the step of forming the etch stop layer in a material that includes a dielectric, or the step of forming the etch stop layer in a material that includes silicon nitride, or the step of forming the etch stop layer in a material that includes a silicon nitride layer overlying a silicon oxide layer. The method may further include the step of forming the etch stop layer to a thickness between about 10 angstroms and about 1000 angstroms.

In the method for forming a contact to a multiple-gate transistor, an etch selectivity of the passivation layer over the etch stop layer is at least 2. The method may further include the step of forming the passivation layer in a material that includes a dielectric, or in a material that includes silicon oxide, or the step of forming the passivation layer to a thickness between about 500 angstroms and about 3000 angstroms. The method may further include the step of filling the contact hole with a metal, or the step of filling the contact hole with a metallic nitride, or the step of filling the contact hole with a metallic silicide, or the step of filling the contact hole with a conductive oxide, or the step of filling the contact hole with a material that includes a heavily doped semi-conducting material.

The present invention is still further directed to a contact to a semiconductor fin that includes a semiconductor fin having a top surface and two sidewall surfaces formed on an insulating substrate; a dielectric layer overlying partially the fin and partially the insulating substrate; and a contact formed of an electrically conductive material in electrical communication with the fin on at least one surface not covered by the dielectric layer.

In the contact to a semiconductor fin, the dielectric layer may include an etch stop layer and a passivation layer. The at least one surface may be at least the top surface, or may be the top surface and the two sidewall surfaces. The fin may further include an end surface. The at least one surface of the fin may be a top surface the two sidewall surfaces and the end surface. The etch stop layer may include a dielectric, may include silicon nitride, may include a silicon nitride layer overlying a silicon oxide layer, and may have a thickness between about 10 angstroms and about 1000 angstroms.

In the contact to a semiconductor fin, an etch selectivity of the passivation layer over the etch stop layer is at least 2. The passivation layer may be formed of a material that includes silicon oxide, or may be formed to a thickness between about 500 angstroms and about 3000 angstroms. The electrically conducive material may include a metal, may include a metallic nitride, may include a metallic silicide, may include a conductive oxide, or may include a heavily doped semi-conducting material.

BRIEF DESCRIPTION OF THE DRAWINGS

These and other objects, features and advantages of the present invention will become apparent from the following detailed description and the appended drawings in which:

FIG. 5 is an enlarged, perspective view of a triple-gate transistor wherein contacts are made to a top planar surface of the silicon source and drain islands.

FIGS. 6A and 6B are enlarged, perspective and plane views, respectively, of a present invention contact in which each contact touches the top surface and the two sidewall surfaces of the semiconductor fin.

DETAILED DESCRIPTION OF THE PREFERRED EMBODIMENT

The present invention provides a method of forming a contact to the semiconductor fin with low contact resistance and large contact area.

Figure 1A:
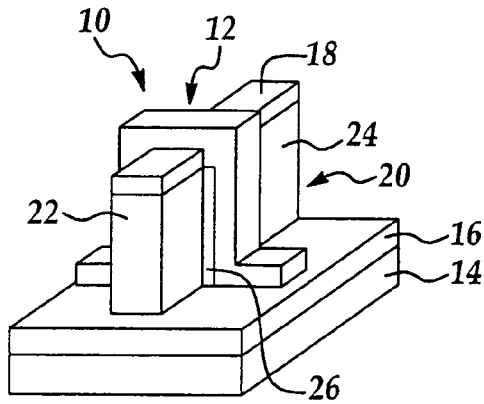
FIGS. 1A-1C are enlarged, perspective, cross-sectional and plane views of a double-gate device structure, respectively.
Figure 1B:
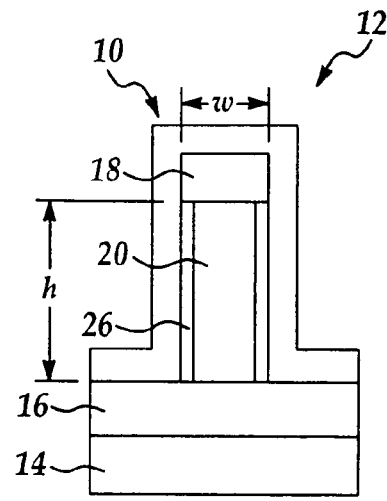
Figure 1C:
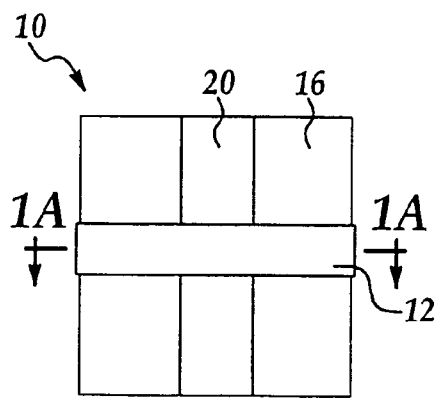
Figure 2A:
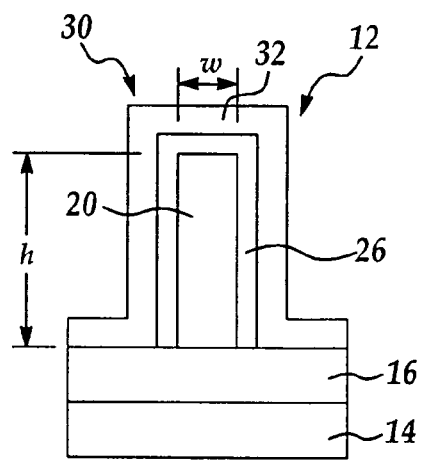
FIGS. 2A-2C are enlarged, cross-sectional views and plane views of a triple-gate structure without and with recessed insulator, respectively.
Figure 2B:
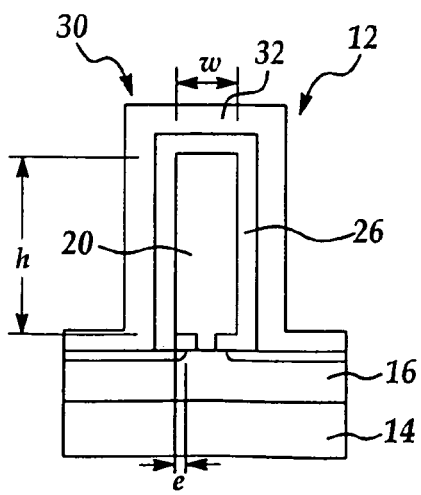
Figure 2C:
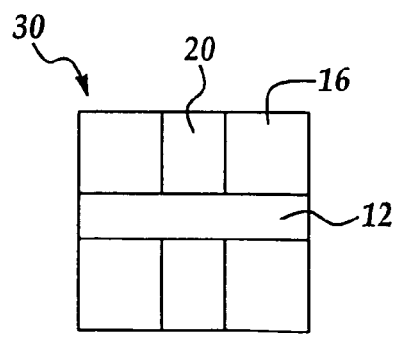
Figure 3A:
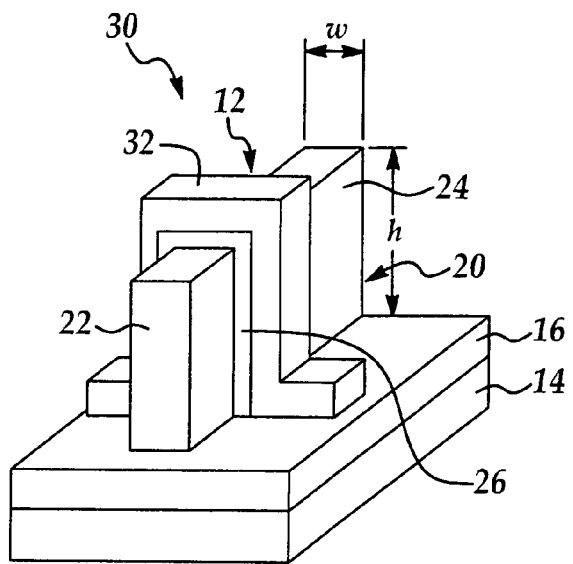
FIGS. 3A-3B are enlarged, perspective views of the triple-gate device structure without and with recessed insulator, respectively.
Figure 3B:
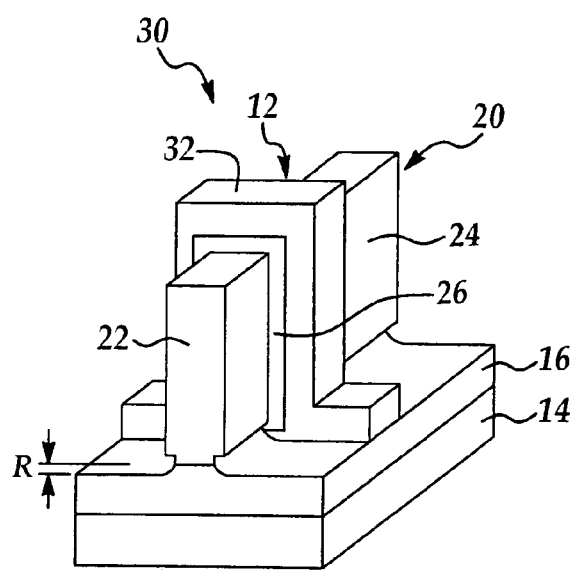
Figure 4:
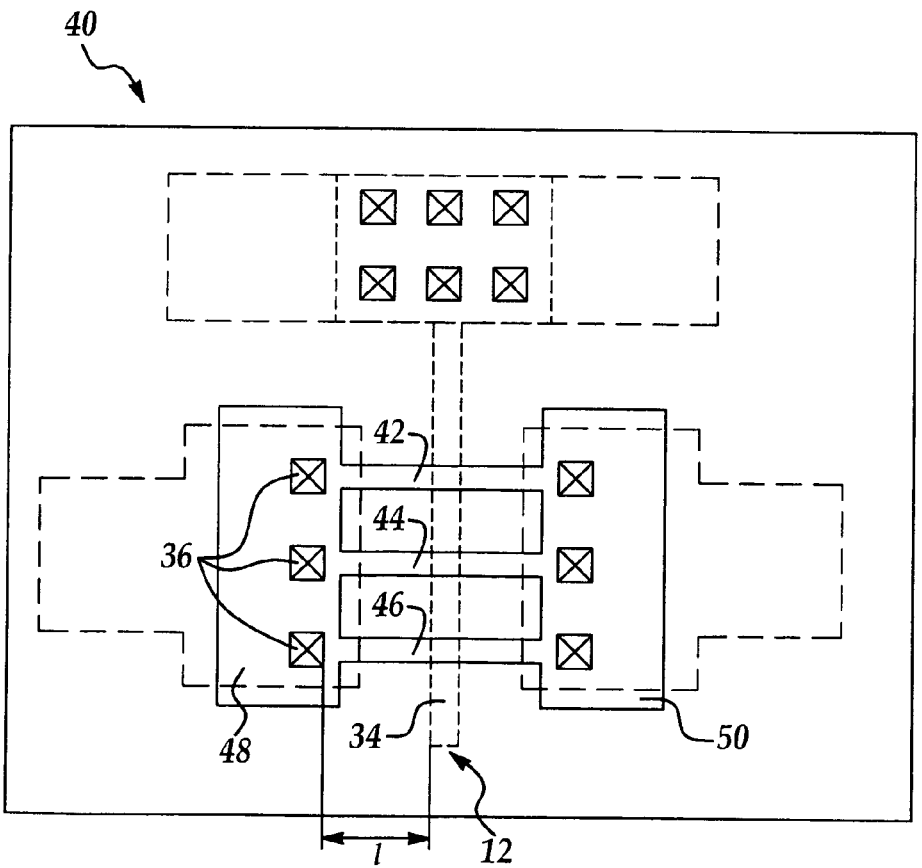
FIG. 4 is an enlarged, plane view of a triple-gate transistor wherein source and drain contact holes expose a top surface of the silicon.

The conventional contact scheme may be improved since the contacts may be brought closer to the channel region for reduced series resistance. The series resistance is a function of the distance "1" between the contacts 36 and the transistor channel region 34, as shown in FIG. 4. A shorter distance leads to a lower series resistance. To shorten the distance between contacts and the channel region, contacts can be formed directly on the silicon fins. In fact, if contact holes overlap the silicon fins and a contact hole formation process is modified to expose the silicon fins, it is possible that the conductive material makes contact with three surfaces of the fin, i.e. the top surface and the two sidewall surfaces.

In FIGS. 6A and 6B, a perspective view and a plane view of contacts 60,62 to a semiconductor fin 64 are illustrated, respectively. In this case, the contact hole (not shown) exposes three surfaces of the fin 64, the top surface 66, and the two sidewall surfaces 68,70. A conductive material 72 fills the contact hole and is in contact with the source or drain region 74,76 on the three surfaces 66,68,70. This contact structure is a three-sided contact structure. The contact surface between the conductive material and the source or drain region is therefore non-planar and different from the conventional contact surface illustrated in FIG. 4. By designing the geometry of the contact surface to be non-planar, the contact area is increased. Since the contact resistance is inversely proportional to the contact surface area, the contact resistance of the structure of FIGS. 6A and 6B is reduced from that in FIG. 4 for the same contact hole area as seen from the plane view of FIG. 6B. The conductive material 72 may be comprised of any conductors. In the preferred embodiment, the conductor comprises of a metal such as tungsten and copper. In another embodiment, the conductor may be a metallic compound such as a metallic nitride or a metallic silicide. Examples of metallic nitrides include titanium nitride, tantalum nitride, and tungsten nitride. In yet another embodiment, the conductor may be a conductive oxide such as ruthenium oxide and indium tin oxide. In yet another embodiment, the conductor can be a heavily doped semiconductor such a n+ doped poly-crystalline silicon.

Figure 7A:
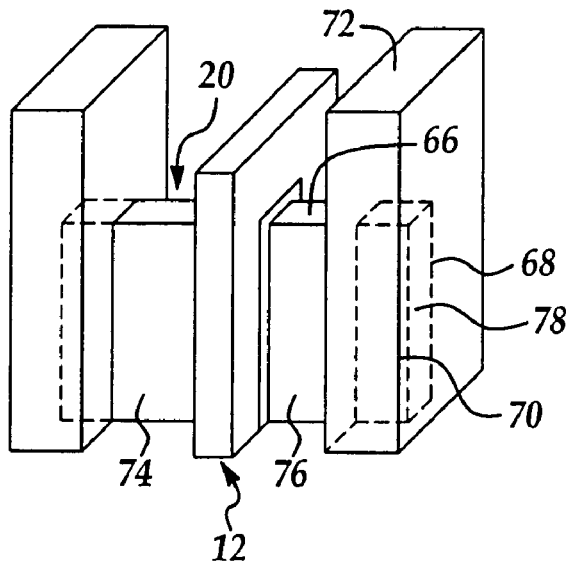
FIGS. 7A and 7B are enlarged, perspective views and plane views, respectively, of a present invention contact in which each contact touches the top surface, the two sidewall surfaces, and the end surface of the semiconductor fin.
Figure 7B:
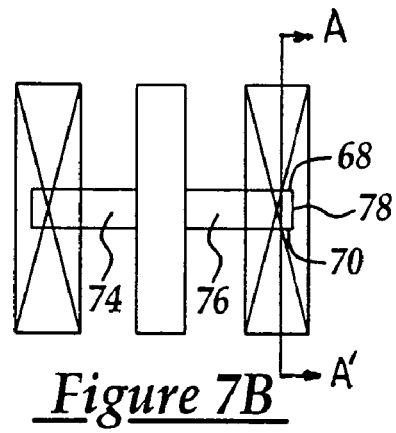

The contact area can be increased if the conductive material also contacts the end surface of the fin. In FIGS. 7A and 7B, a perspective view and a plane view of another embodiment of a contact to a semiconductor fin is illustrated, respectively. In this case, the contact hole exposes four surfaces of the fin: the top surface 66, the two sidewall surfaces 68,70, and the end surface 78. A conductive materials 72 fills the contact hole and is in contact with the source or drain regions 74,76 on the four surfaces 66,68,70,78. The contact structure is a four-sided contact structure. The contact surface is non-planar and is greater than that of the structure shown in FIG. 6 for a given contact hole area as seen from the plane view. As a result, the contact structure produces a smaller contact resistance. It should be noted that, in the present invention, since conductive materials may be in direct contact with the silicon fins, there is no need for the formation of source and drain islands which were described in the prior art.

Figure 8:
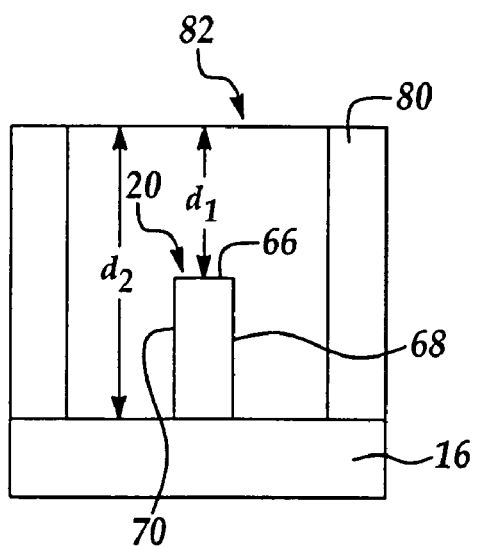
FIG. 8 is an enlarged, cross-sectional view of the contact hole taken along line A-A' of FIG. 7B prior to the filling of a conductive material in the hole.

The present invention provides a novel method for forming the contact structures of FIGS. 6A-7B. It should be noted that the sidewall surfaces may be covered by a spacer material depending on the fabrication process, and the spacer material may be removed during the contact hole etch process. In order to achieve contact with the two sidewall surfaces of the semiconductor fin, the conventional contact hole formation process must be modified. For example, the contact hole depth is different in different portions of the contact hole. As an illustration, a cross-sectional view taken along line A-A of the contact structure of FIG. 7B is shown in FIG. 8. A passivation layer 80 covers the fin 20 prior to the contact formation process step. The passivation layer 80 is usually silicon oxide formed by a chemical vapor deposition process. There are a few potential problems in the contact hole 82 etching process. First, depth of the contact hole 82 is $d_1$ in the portion of the contact hole above the top surface 66 of the fin 20, while the depth of the contact hole 82 is $d_2$ in the portion of the contact hole not overlapping with the fin 20 in the cross-sectional view.

Figure 9:
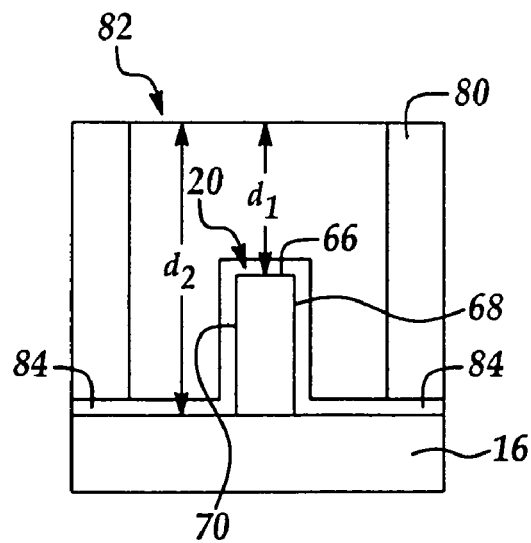
FIG. 9 is an enlarged, cross-sectional view of a contact hole with an etch stop layer for preventing the etching of the semiconductor fin and the underlying insulator.

As a result, the top surface 66 of the fin 20 will be exposed to the contact hole etching process for an extended period of time depending on the height of the fin. The taller the fin, the longer the over-etching on the top surface of the fin. The over-etching consumes a portion of the fin 20 and should be avoided. Second, since the passivation layer 80 is typically made of a material similar to that for the insulator 16 underlying the fin 20, i.e. silicon oxide, the contact etch process consumes a portion of the insulator. The problem does not exist in the conventional contact etch structure of FIG. 4. An over-etch in the contact etch process can result in a recessed insulator in the contact hole region not covered by the fin. To avoid the above problems of forming a contact hole to expose the silicon sidewalls, a contact etch stop layer 84 is used to cover the fin 20 and the insulator layer 16 prior to the deposition of the passivation layer and the contact hole etch. The contact etch stop layer 84 may be a material with a different etch rate compared to the etch rate of the passivation layer 80. The etch stop layer 84 is shown in FIG. 9. Etching of the passivation layer 80 to form the contact hole 82 stops on the etch stop layer 84. Hence, the etch stop layer 84 serves two purposes in the present invention method. First, it protects the fin 20 from being etched when the contact hole 82 is being etched beyond a depth of $d_1$. Secondly, it protects the insulator 16 from being etched after the contact hole 82 is fully etched to a depth of $d_2$. After the contact hole etch process is stopped at the contact etch stop layer 84, the contact etch stop layer 84 may be removed in the contact hole region using an etch process that is selective to the material constituting the contact etch stop layer 84, i.e. the etch rate of the contact etch stop layer 84 should be substantially different from that of the material constituting the underlying insulator 16 and semiconductor fin 20. For example, the contact etch stop layer 84 may be a dielectric layer such as a silicon nitride layer, or a stack consisting of silicon nitride and silicon oxynitride layers. The provision of a contact etch stop layer 84 in the contact formation process for multiple-gate transistors is only made possible by the present invention novel method. The contact etch stop layer 84 is particularly important in the formation of a contact to the sidewall surfaces 68,70 of the fin.

Figure 10:
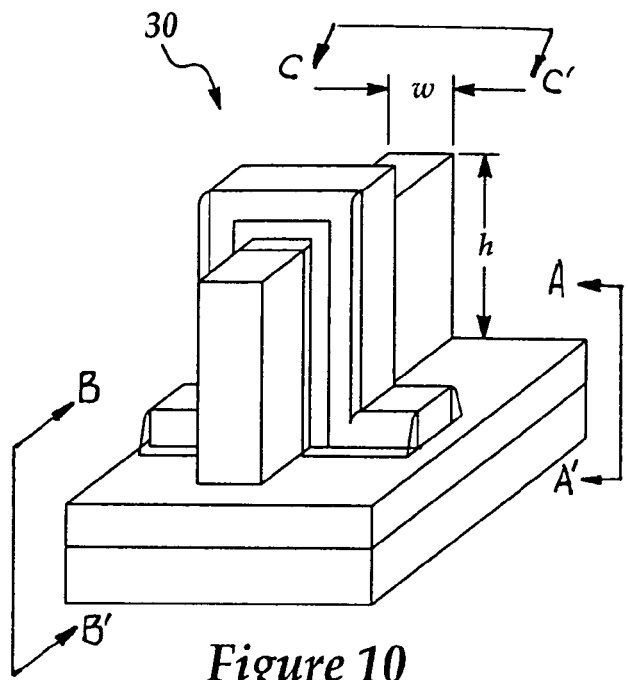
FIG. 10 is an enlarged, perspective view of a present invention triple-gate transistor complete prior to the contact formation steps.
Figure 11A:
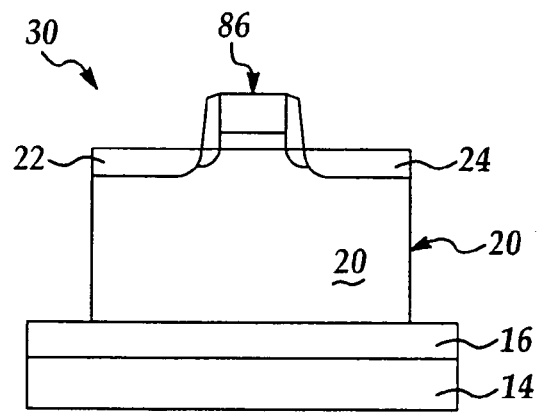
FIGS. 11A-11D are enlarged, cross-sectional views illustrating the present invention process steps for forming contacts to a triple-gate transistor.
Figure 11B:
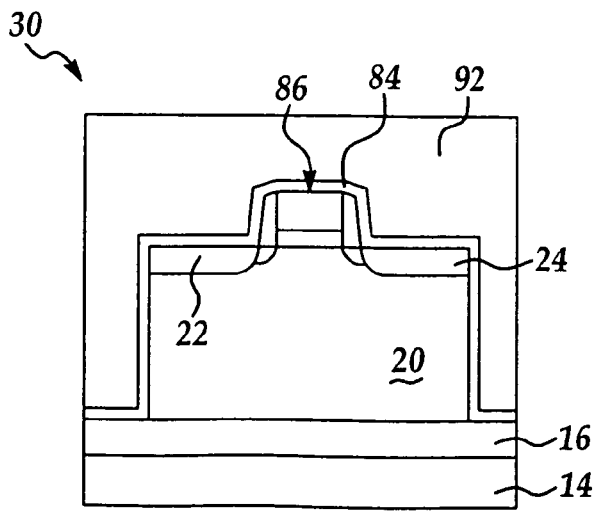
Figure 11C:
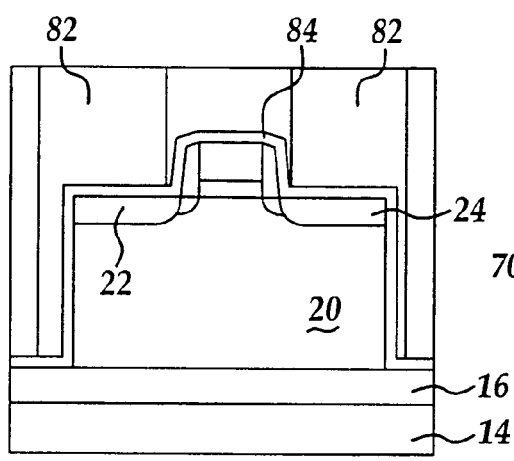
Figure 11D:
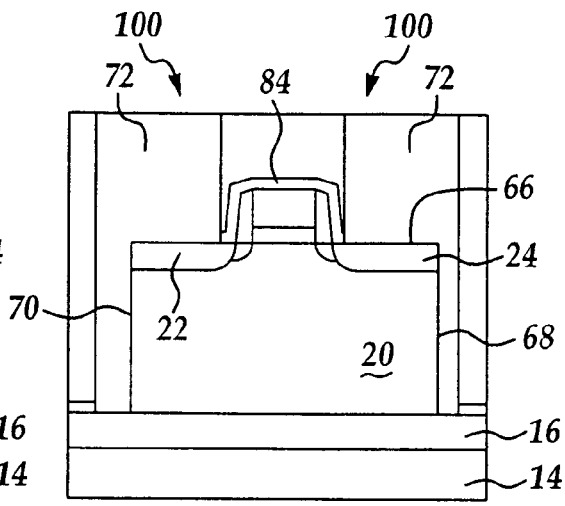
Figure 12A:
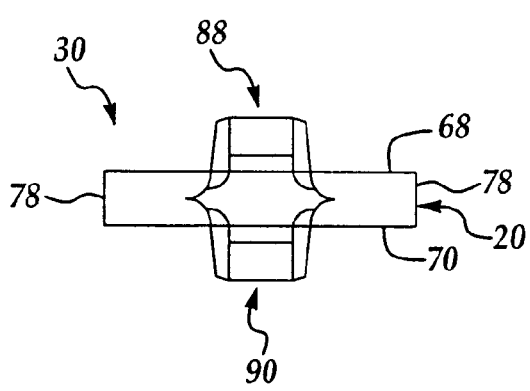
FIGS. 12A-12D are enlarged, cross-sectional views illustrating the formation of a self-aligned contact in a triple-gate transistor.

The method for forming a contact to a semiconductor fin is described in detail below. The process begins with a complete device that includes a semiconductor fin. The device is preferably a multiple-gate transistor, i.e. a double-gate transistor, a triple-gate transistor or an omega-FET. The semiconductor fin is preferably formed of silicon. The source and drain regions of the silicon fin may be strapped by a conductive material such as a silicide, commonly known and used in the art to reduce the series resistance in the source and drain regions of the transistors. In the schematics of FIGS. 11 and 12, the source or drain regions 22,24 are doped regions in the semiconductor fin 20 and may also be a doped region in the semiconductor fin 20 with an overlying silicide layer. For illustration purposes, a triple-gate transistor 30 completed up to the step prior to contact formation is shown in FIG. 10. A cross-sectional view of the triple-gate transistor 30 in the plane containing B-B is shown in FIG. 11A. In the cross-section, the plane cuts through the top surface of the fin 20 and the gate 66 overlying the top surface 66 of the fin 20. A cross-sectional view of the transistor in the horizontal plane containing C-C is shown in FIG. 12A. In this cross-section, the plane cuts through the two electrodes 88,90 on the sidewalls 68,70 of the fin 20. FIGS. 11 and 12 illustrate the process for forming the contact to the semiconductor fin 20.

Figure 12B:
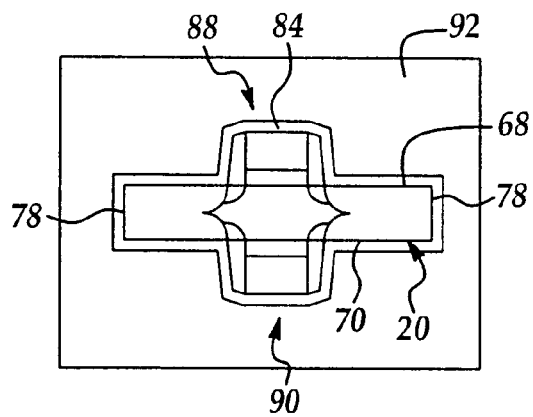

The method of forming the contact begins with the complete triple-gate transistor 30 as shown in FIGS. 11A and 12A. A contact etch stop layer 84 is then deposited. The contact etch stop layer is deposited to cover the entire device structure using techniques known in the art, i.e. chemical vapor deposition. The contact etch stop layer 84 may be formed of a dielectric material such as silicon nitride which has an etch rate that is substantially lower than that of the passivation layer material. In the preferred embodiment, the contact etch stop layer 84 comprises silicon nitride. It may also be a composite layer including a plurality of layers such as a silicon nitride layer overlying a silicon oxide layer. The thickness of the contact etch stop layer 84 is in the range of 10 angstroms to 1000 angstroms. Next, a passivation layer 92 is deposited. The passivation layer 92 may be formed of a dielectric material such as silicon oxide; the silicon oxide passivation layer can be deposited by low pressure chemical vapor deposition using tetraethosiloxane (TEOS) in a temperature range between about 650 and 900 degrees Celsius. The thickness of the passivation layer is between about 500 and about 3000 angstroms. The resulting cross-sections are shown in FIGS. 11B and 12B.

Figure 12C:
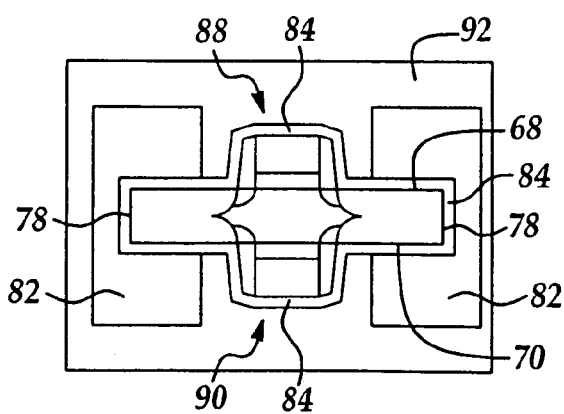
Figure 12D:
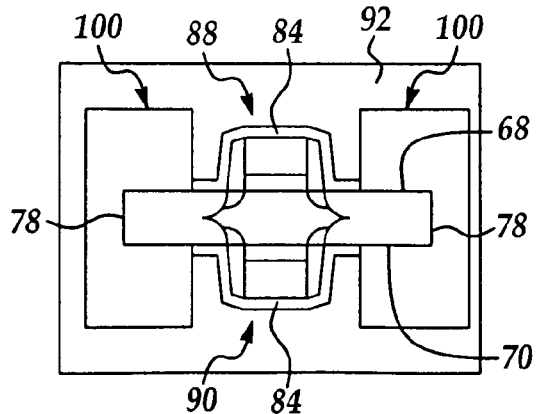

Selected portions of the passivation layer 92 are then patterned using lithography techniques and etched to form contact holes 82 in the passivation layer 92. Etching may be accomplished in a reactive plasma etcher using a reactant gas mixture such as carbon tetrafluoride and hydrogen. The contact hole etch stops on the contact etch stop layer 84, as shown in FIGS. 11C and 12C. The regions exposed by the contact hole are covered by the contact etch stop layer 84 on the sidewall and end surfaces of the fin, as well as the contact etch stop layer on the insulator 16 in the contact hole 82. This exposes the fin top surface 66, the sidewall surfaces 68,70 of the fin 20, the end surface 78 of the fin, and the insulator layer 16 or buried oxide in the contact hole 82. To achieve the removal of the contact etch stop layer 84 on the sidewall surfaces 68,70 and end surfaces 78 of the fin, the etch process should have a high degree of isotropy. This can be achieved by a reactive ion etching process using a reactive gas such as $CF_4$. Contact hole 82 is then filled with a conductive material 72 forming contact 100, as shown in FIGS. 11D and 12D. The conductive contact material 72 may be any conductor. The conductor may be a metal such as tungsten and copper, a metallic nitride such as titanium nitride, tantalum nitride, and tungsten nitride, a conductive oxide such as ruthenium oxide and indium tin oxide, or a heavily doped semiconductor such as n+ doped poly-crystalline silicon. The contact hole may also be filled with a combination of the above mentioned conductors.

The contact formation process may generally be applied to other semiconductor device structures equipped with a semiconductor fin, for example, the omega-FET structure and the double-gate transistor structure, as previously described.

While several embodiment of the invention, together with modifications thereof, have been described in detail herein and illustrated in the accompanying drawings, it will be event that various modifications are possible without departing from the scope of the present invention. The examples given are intended to be illustrative, rather than exclusive.

While the present invention has been described in an illustrative manner, it should be understood that the terminology used is intended to be in a nature of words of description rather than of limitation.

Furthermore, while the present invention has been described in terms of a preferred and alternate embodiment, it is to be appreciated that those skilled in the art will readily apply these teachings to other possible variations of the inventions.

The embodiment of the invention in which an exclusive property or privilege is claimed are defined as follows.

What is claimed is:

1. A method for forming a contact to a semiconductor fin comprising the steps of:
    providing a semiconductor fin having a top surface, two sidewall surfaces and at least one end surface;
    forming an etch stop layer comprising silicon nitride overlying said fin;
    forming a passivation layer overlying the etch stop layer;
    forming a contact hole in said passivation layer exposing said etch stop layer;
    removing said etch stop layer in said contact hole; and
    filling said contact hole with an electrically conductive material.

2. The method of claim 1 further comprising the step of exposing said etch stop layer on said top surface and said two sidewall surfaces of the fin.

3. The method of claim 1 further comprising the step of exposing said etch stop layer on said top surface and said two sidewall surfaces and said at least one end surface of the fin.

4. The method of claim 1 further comprising the step of forming said etch stop layer in a dielectric material.

5. The method of claim 1 further comprising the step of forming said etch stop layer in a silicon nitride layer overlying a silicon oxide layer.

6. The method of claim 1 further comprising the step of forming said etch stop layer to a thickness between about 10 angstroms and about 1000 angstroms.

7. The method of claim 1, wherein an etch selectivity of said passivation layer over said etch stop layer is at least 2.

8. The method of claim 1 further comprising the step of forming said passivation layer using a dielectric material.

9. The method of claim 1 further comprising the step of forming said passivation layer using silicon oxide.

10. The method of claim 1, wherein said passivation layer is formed to a thickness between about 500 angstroms and about 3000 angstroms.

11. The method of claim 1, wherein said electrically conductive material comprises metal.

12. The method of claim 1, wherein said electrically conductive material comprises a metallic nitride.

13. The method of claim 1, wherein said electrically conductive material comprises a metallic silicide.

14. The method of claim 1, wherein said electrically conductive material comprises a conductive oxide.

15. The method of claim 1, wherein said electrically conductive material comprises a heavily doped semiconducting material.

16. A method for forming a contact to a multiple-gate transistor fin comprising the steps of:
    providing a multiple-gate transistor comprising a fin;
    forming an etch stop layer overlying said fin;
    forming a passivation layer overlying said etch stop layer;
    forming a contact hole in said passivation layer exposing said etch stop layer, said exposed etch stop layer overlying a top surface and a sidewall surface of said fin;
    removing said etch stop layer exposed in said contact hole; and
    filling said contact hole with an electrically conductive material.

17. The method of claim 16, wherein the multiple-gate transistor is a double-gate transistor.

18. The method of claim 16, wherein the multiple-gate transistor is a triple-gate transistor.

19. The method of claim 16, wherein the multiple-gate transistor is an omega field-effect transistor.

20. The method of claim 16, wherein said etch stop layer comprises a dielectric.

21. The method of claim 16, wherein said etch stop layer comprises silicon nitride.

22. The method of claim 16, wherein said etch stop layer comprises a silicon nitride layer overlying a silicon oxide layer.

23. The method of claim 16, wherein said etch stop layer is formed to a thickness between about 10 angstroms and about 1000 angstroms.

24. The method of claim 16, wherein said etch selectivity of said passivation layer over said etch stop layer is at least 2.

25. The method of claim 16, wherein said passivation layer comprises a dielectric.

26. The method of claim 16, wherein said passivation layer comprises silicon oxide.

27. The method of claim 16, wherein said passivation layer is formed to a thickness between about 500 angstroms and about 3000 angstroms.

28. The method of claim 16, wherein said electrically conductive material comprises a metal.

29. The method of claim 16, wherein said electrically conductive material comprises a metallic nitride.

30. The method of claim 16, wherein said electrically conductive material comprises a metallic silicide.

31. The method of claim 16, wherein said electrically conductive material comprises a conductive oxide.

32. The method of claim 16, wherein said electrically conductive material comprises a heavily doped semiconductor.

33. The method of claim 16, wherein said exposed etch stop layer overlies a top surface and two sidewall surfaces of the fin.

34. The method of claim 16 wherein said exposed etch stop layer overlies a top surface, two sidewall surfaces, and at least one end surface of the fin.

35. A method for forming a contact to a semiconductor fin comprising the steps of:
    providing a semiconductor fin having a top surface, two sidewall surfaces and at least one end surface;
    forming an etch stop layer overlying said fin;
    forming a passivation layer overlying the etch stop layer;
    forming a contact hole in said passivation layer exposing said etch stop layer, said exposed etch stop layer overlying a top surface and said two sidewall surfaces of the fin;
    removing said etch stop layer in said contact hole; and
    filling said contact hole with an electrically conductive material.

36. The method of claim 35, wherein said exposed etch stop layer further overlies said at least one end surface of the fin.

37. The method of claim 35, wherein said etch stop layer comprises a silicon nitride.

38. The method of claim 35, wherein said etch stop layer comprises a silicon nitride layer overlying a silicon oxide layer.

39. The method of claim 35, wherein an etch selectivity of said passivation layer over said etch stop layer is at least 2.

40. The method of claim 35, wherein said passivation layer is formed of a material comprising a dielectric.

41. The method of claim 35, wherein said passivation layer is formed of a material comprising silicon oxide.

42. The method of claim 35, wherein said electrically conductive material comprises a metallic silicide.

43. The method of claim 35, wherein said electrically conductive material comprises a conductive oxide.

44. The method of claim 35, wherein said electrically conductive material comprises a heavily doped semiconductor.

* * * * *